United States Patent
Jefremow et al.

(10) Patent No.: US 8,837,210 B2
(45) Date of Patent: *Sep. 16, 2014

(54) DIFFERENTIAL SENSING METHOD AND SYSTEM FOR STT MRAM

(75) Inventors: Mihail Jefremow, Augsburg (DE); Wolf Allers, Munich (DE); Jan Otterstedt, Unterhaching (DE); Christian Peters, Vaterstetten (DE); Thomas Kern, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/592,404

(22) Filed: Aug. 23, 2012

(65) Prior Publication Data
US 2014/0056058 A1  Feb. 27, 2014

(51) Int. Cl.
*G11C 11/00* (2006.01)

(52) U.S. Cl.
USPC ........................................ 365/158; 365/210.1

(58) Field of Classification Search
USPC ................................ 365/158, 210.1, 189.15
See application file for complete search history.

(56) References Cited

U.S. PATENT DOCUMENTS

2011/0080763 A1*  4/2011  Siau et al. ................... 365/51
2011/0122679 A1   5/2011  Chen et al.

FOREIGN PATENT DOCUMENTS

DE    19947118 C1   3/2001

OTHER PUBLICATIONS

U.S. Appl. No. 13/592,597 dated Aug. 23, 2012.

* cited by examiner

*Primary Examiner* — Huan Hoang
(74) *Attorney, Agent, or Firm* — Eschweiler & Associates, LLC

(57) ABSTRACT

The invention relates to methods and systems for reading a memory cell and in particular, an STT MRAM. In accordance with one aspect of the invention, a system for reading a memory cell includes a read path and a precharge path. The reference current is provided through the read path and is sampled via a sampling element in the read path. Subsequently, a current from the memory cell is provided through the same sampling element and read path. The output level is then determined by the cell current working against the sampled reference current.

32 Claims, 5 Drawing Sheets

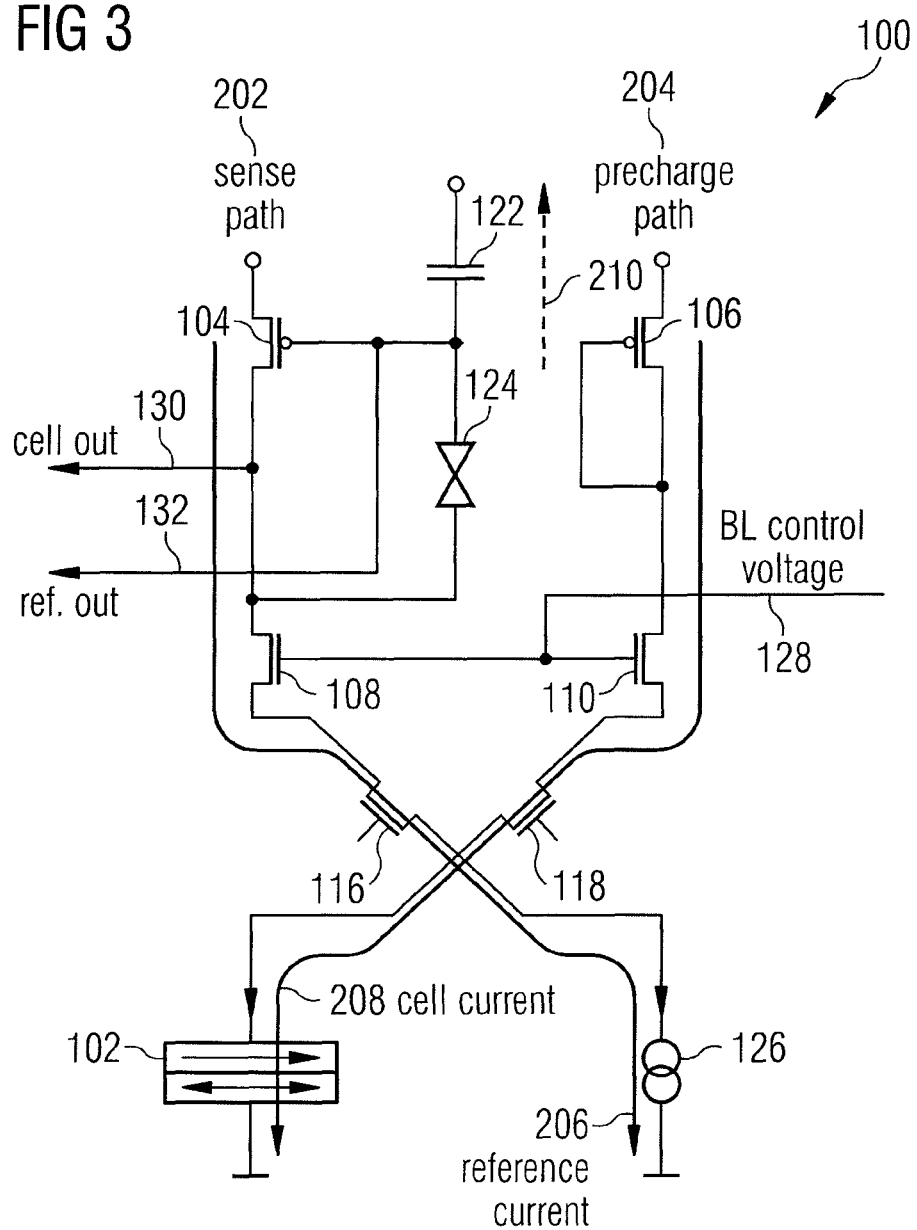

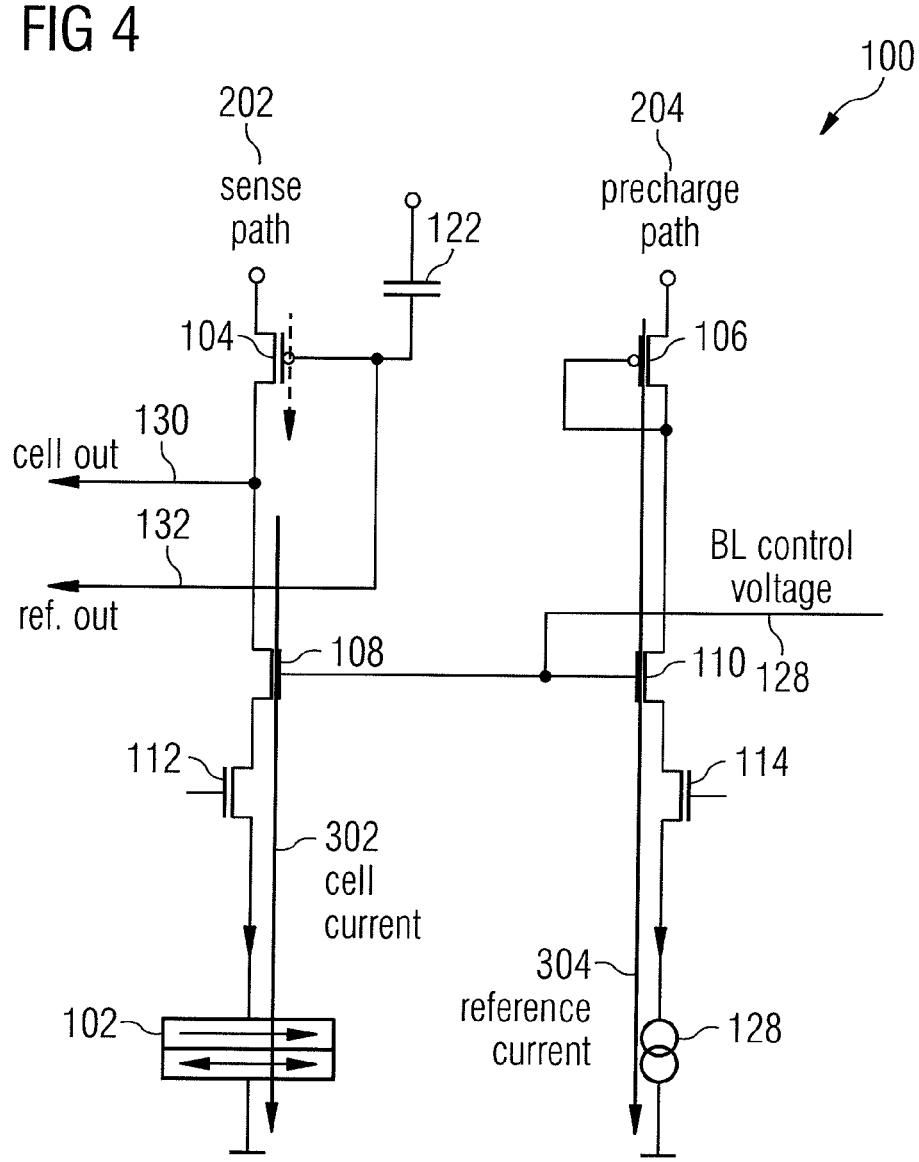

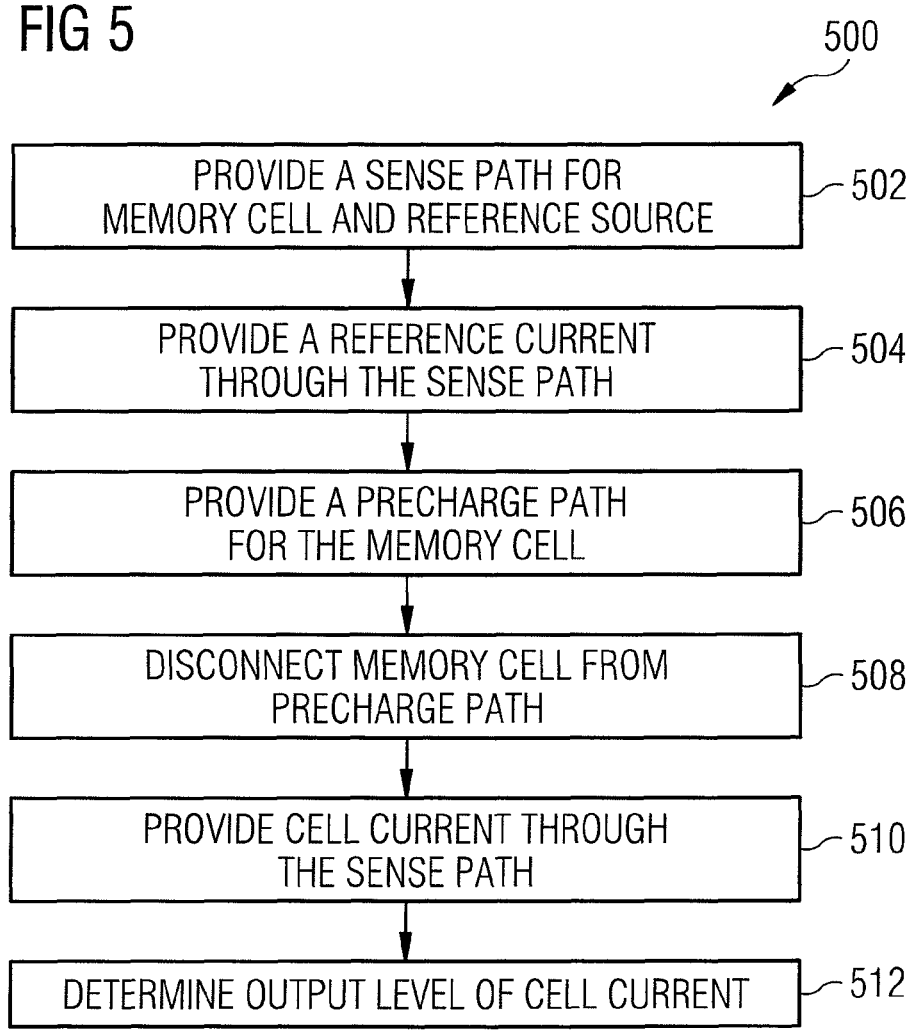

DIFFERENTIAL SENSING METHOD AND SYSTEM FOR STT MRAM

FIELD

The invention relates to methods and systems for reading random access memory cells. More specifically, the invention relates to methods and systems for sensing a magnetic memory cell and in particular a Spin Transfer Torque Magnetoresistive Random Access Memory (STT MRAM) cell.

BACKGROUND

Magnetoresistive random access memory (MRAM) is a non-volatile random access memory in which data is stored by magnetic storage elements.

A conventional MRAM cell comprises two ferromagnetic plates separated by a thin insulating layer. One of the two plates is a permanent magnet ("fixed layer") set to a particular polarity while the field of the second plate ("free layer") can be configured to match that of an external field to store data. This configuration is known as a spin valve and is the simplest structure for an MRAM bit. Such magnetic memory cells may be combined to form a memory device.

Sensing or reading of a magnetic memory cell is accomplished by measuring the electrical resistance of the cell. A particular cell is typically selected by powering an associated transistor that switches current from a bitline through the cell to ground. The electrical resistance of the cell changes due to the spin orientation of the electrons in the two plates of the STT MRAM cell. By measuring the resulting current, the resistance inside any particular cell can be determined. In general, the cell is considered to be a "1" if the two plates have the same polarity and a "0" if the two plates are of opposite polarity and have a higher resistance.

FIG. 1 is an example schematic diagram of a prior art system 10 for sensing a magnetic memory cell 12 such as a Spin Transfer Torque Magnetoresistive Random Access Memory (STT MRAM) cell. The prior art system 10 comprises a plurality of transistors, 14, 16, 18 and 20, a reference current source 22 for providing a reference current 24, a cell current 26, a bitline (BL) control voltage 28, a cell output node 30, a reference output 32 and a mirrored reference current 34. The transistors 14 and 16 may be PMOS transistors, while the remaining transistors 18 and 20 may be NMOS transistors.

In operation, the two pairs of transistors of the prior art sensing system 10 adjust and sense the cell current 26 and the reference current 24 and convert this current difference into a voltage difference between the output nodes 30 and 32. The first pair of transistors 14 and 16 acts as a current mirror while transistors 18 and 20 act as clamp devices for bitline voltage regulation, which may be adjusted by the BL control voltage 28. After the BL control voltage 28 is set, transistors 18 and 20 charge the reference bitline 36 and the cell bitline 38 to a fixed potential which is typically about one threshold voltage of NMOS transistor below BL control voltage 28. The diode connected PMOS transistor 16, which is part of the current mirror, senses the reference current 24 which flows through the NMOS transistor 20. The reference current source 22 is conventionally implemented by an NMOS transistor with accurately controlled gate voltage or by so called reference cells such as preconditioned STT MRAM cells. The reference current 24 is usually set between the current which corresponds to a high current STT MRAM cell state and the current corresponding to a low current STT MRAM cell state. This reference current 24 is mirrored simultaneously by the PMOS current mirror 14, 16 to the cell reference out node 30. The cell current 26 flows through the NMOS transistor 18 to the cell out node 30. If the cell current 26 is higher than the reference current 24, then the cell out voltage 30 is driven to ground. If the cell current 26 is lower than the reference current 24, then the cell out voltage 30 goes up to VDD. The voltage at the reference out node 32 remains fixed at about one threshold voltage of the PMOS transistor 16 below VDD due to the diode connected PMOS 16. The voltage difference between the cell out node 30 and the reference out node 32 is compared and amplified by a subsequent differential latch circuit (not shown) to a full CMOS level.

Two of the main problems with the prior art sensing system 10 are the accuracy of the mirrored reference current, Iref mir 34, and the difference between the bitline voltage 38 and the reference bitline voltage 36 if the difference of the cell currents between a high current cell state and low current cell state of the STT MRAM cell, also known at the read window, is small. These two effects diminish the accuracy of the sense amplifier by resulting in two limiting factors for the read window: the current mirror in the sense amplifier and the devices controlling the bit line voltage which are necessary for the STT MRAM memory cell.

The mismatch of the threshold voltages Vtp of the PMOS transistors 14, 16 in the current mirror leads to a mismatch of the mirrored reference current Iref mir 34 and the reference current Iref 24. The mismatch of the threshold voltages Vtn of the NMOS transistors 18, 20 results in different voltages across the selected STT-MRAM cell 12 and the reference current source 22, which may also be a preconditioned STT-MRAM cell. This voltage difference leads to a current difference between the reference current 24 and the cell current 26 for the same resistances for both paths since the current of an STT MRAM cell is directly proportional to a voltage across it.

Therefore, there exists a need for a system and a method for sensing a magnetic memory cell, such as an STT MRAM, which do not have these disadvantages.

SUMMARY

In accordance with one aspect of the invention, there is provided a system for sensing or reading a memory cell, such as an STT MRAM, comprising a read path which may be coupled to either a reference source or to the memory cell, and a precharge path coupled to the memory cell for precharging the memory cell, wherein the memory cell is switched from the precharge path to the read path after the reference current has flowed through the read path. In one embodiment, the read path may comprise a diode connected sampling element for sampling and holding the reference current and a bit line control device for controlling the bit line control voltage. When the reference source is connected to the read path, the reference current is sampled by the voltage across the sampling element on a capacitance. The memory cell is then disconnected from the precharge path and provides a cell current through the same read path. The output level of the sensing system is determined by the cell current working against the sampled reference current.

In accordance with a further aspect of the invention, there is provided a method for reading or sensing a memory cell, such as an STT MRAM. In one embodiment, the method comprises providing a sampling element for sampling a reference current and measuring a cell current from the memory cell using the sampling element through the same read path. The reference current may be sampled using the voltage across the gate of the sampling element on a capacitance. The method may further provide a precharge path for the memory cell around the same time that the reference current is measured using the sampling element. The capacitance may then be disconnected from the gate of the sampling element, and the memory cell may then be switched from the precharge path to the read path through the same sampling element. The output is then determined by the cell current working against the sampled reference current.

In another embodiment, the method comprises providing a sense path for the memory cell and an associated reference source, providing a reference current through the sense path, providing a precharge path for the memory cell at substantially the same time that the reference current is provided through the sense path, disconnecting the memory cell from the precharge path, and providing a cell current from the memory cell through the sense path.

In one embodiment, the sense path comprises a diode connected sampling transistor. Initially, the reference current is sampled by the voltage across the gate of the sampling transistor on a capacitance as it flows through the sense path. After the reference current has been sampled, the sampling transistor is then used to measure the cell current from the memory cell. The output of the sensing system is determined by the cell current working against the sampled reference current.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

FIG. 3 is an example schematic diagram of a sensing system for a magnetic memory cell in accordance with one embodiment of the present invention.

FIG. 4 is an example schematic diagram of a sensing system for a magnetic memory cell in accordance with one embodiment of the present invention.

FIG. 5 is a flowchart illustrating a method for sensing a magnetic memory call in accordance with one embodiment of the present invention.

DETAILED DESCRIPTION

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. Therefore, the following detailed description is not to be taken in a limiting sense, and the scope of the present invention is defined by the appended claims.

Figure 1:
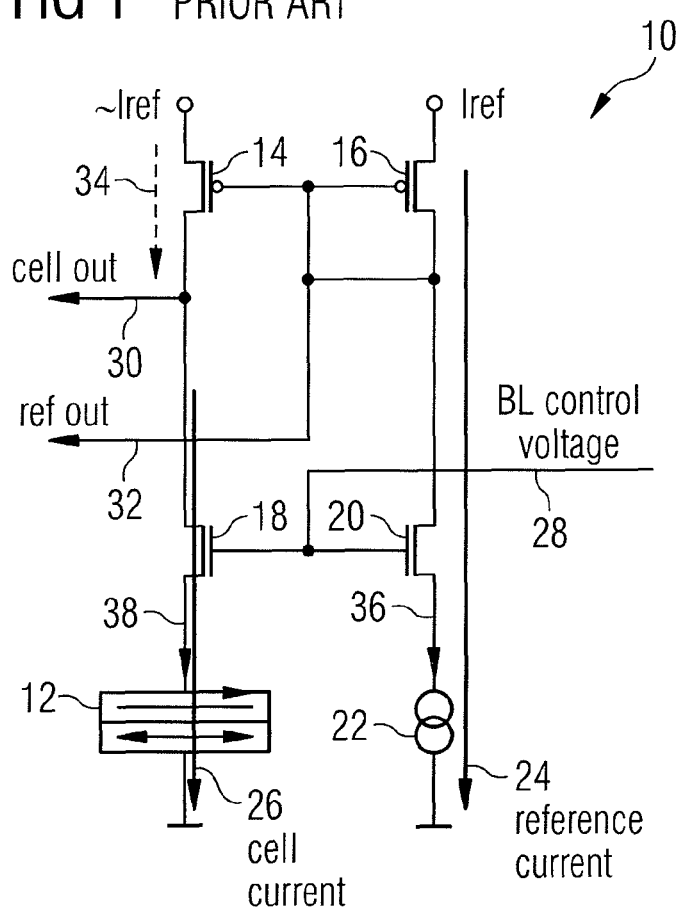
FIG. 1 is a schematic diagram of a conventional embodiment of a magnetic memory cell and a sense amplifier.
Figure 2:
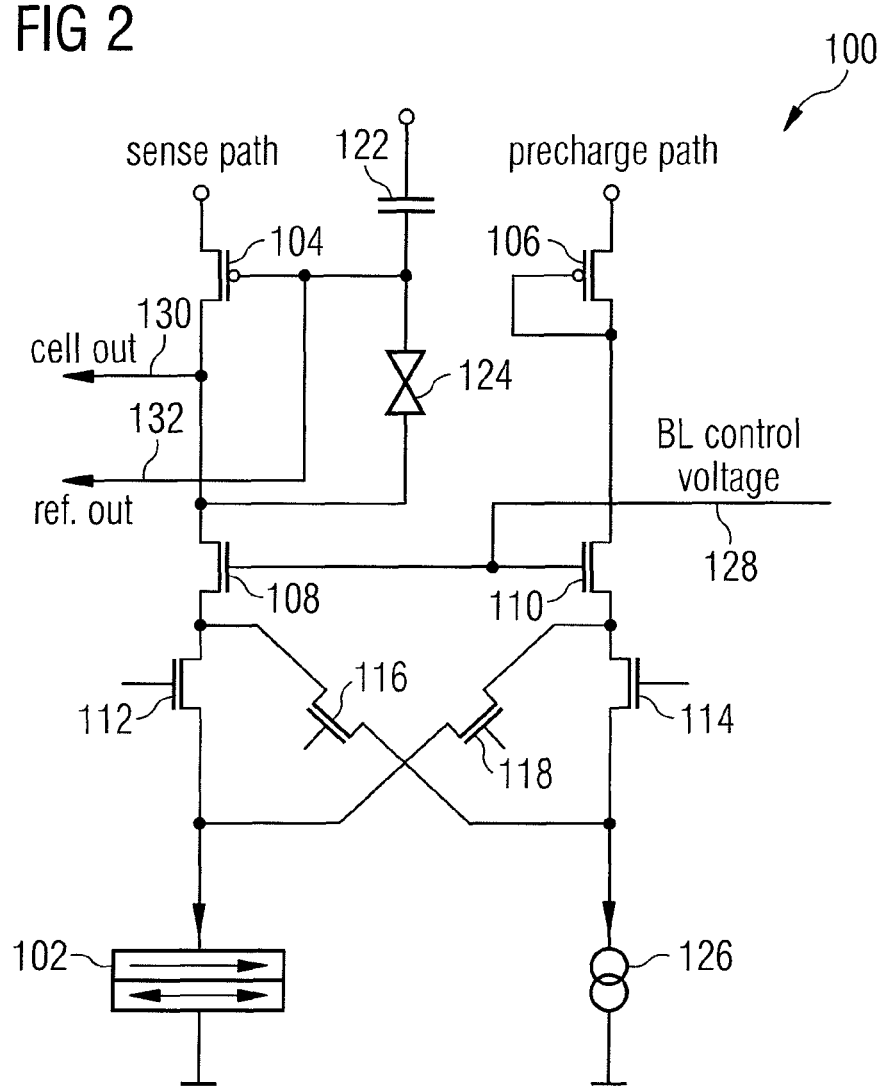
FIG. 2 is an example schematic diagram of a sensing system for a magnetic memory cell in accordance with one embodiment of the present invention.

FIG. 2 is an example schematic diagram of a system 100 for sensing or reading a magnetic memory cell in accordance with one embodiment of the present invention. The system 100 comprises a magnetic memory cell 102 such as a Spin Transfer Torque Magnetoresistive Random Access Memory (STT MRAM) cell which is to be sensed or read by the system 100. The system 100 further includes a plurality of transistors, 104, 106, 108, 110, 112, 114, 116 and 118, a capacitance 122, a switch 124, a reference current source 126, a bit line control voltage 128, a cell output 130, and a reference output 132.

In one embodiment, the transistors 104 and 106 may be PMOS transistors, while the remaining transistors 108, 110, 112, 114, 116 and 118 may be NMOS transistors. Transistor 104 may be referred to as a "sampling element" because in accordance with one embodiment of the present invention, the sampling element 104 samples and holds the reference current. One skilled in the art will realize that the sampling element 104 is not limited to a transistor but may comprise any sampling element or combination of elements that samples and holds the reference current. One skilled in the art will also realize that the present invention is not limited to the sensing or reading of a single memory cell, but that the invention may be used to read an array of magnetic memory cells and that the following description referring to one memory cell is for the purpose of simplification only.

The system 100 of the present invention overcomes the mismatch problem by eliminating the current mirror. In one embodiment of the present invention, the reference current and the cell current are fed through the same transistors 104 and 108, consecutively. In other words, first the reference current is fed through transistors 104 and 108, and then the current from the memory cell is fed through transistors 108 and 104. This two step approach for reading the memory cell through the same transistors advantageously avoids any mismatch effect between the bit line control devices and the mirror transistors.

FIG. 3 is an example schematic diagram of a system 100 for sensing or reading a magnetic memory cell in accordance with one embodiment of the present invention. FIG. 3 illustrates two paths of the system 100, the sense or read path 202 and the precharge path 204. In accordance with one embodiment of the operation of the system 100, the reference source 126 is connected to the sense path 202 of system 100. This may be accomplished by setting an appropriate bit line control voltage 128 and enabling the transistor 116. The reference current flows through the sense path 202, through transistor 108 and 104. In one embodiment, transistor 104 is a diode connected transistor. During this phase, the digital switch 124 is on, and the reference current 206 is sampled by the gate-to-source voltage of the sampling transistor 104 on a capacitance 122 as illustrated by dashed line 210.

At substantially the same time, the memory cell 102 is connected to the precharge path 204 by setting an appropriate bit line control voltage 128 and enabling transistor 118. This allows the present invention to advantageously avoid any extra waiting time when reading the memory cell 102 by precharging the memory cell 102 at substantially the same time as the reference current is being sampled by the sampling transistor 104. One skilled in the art will realize that passing the reference current through the sampling transistor 104 and precharging the memory cell 102 may not occur at exactly the same time but that it is advantageous in one embodiment of the present invention to perform these two steps at substantially the same time so as to have as minimal an impact on the total read time of the memory cell 102.

FIG. 4 is an exemplary schematic diagram of a system 100 for sensing a magnetic memory cell in accordance with one embodiment of the present invention. After the memory cell 102 has been precharged and the reference current information has been read, as described above with reference to FIG. 3, the memory cell 102 is switched from the precharge path 204 to the read path 202, as illustrated by the cell current line 302, by setting an appropriate bit line control voltage 128 and enabling transistor 112. The reference source 126 is switched from the sense path 202 to the precharge path 204, as illustrated by line 304, by setting an appropriate bit line control voltage 128 and enabling transistor 114. At substantially the same time, the capacitance 122 is disconnected from the reference out node 132 via the switch 124. The output of the sensing system 100 is then determined by the cell current working against the sampled reference current, i.e. active load of sampling transistor 104. Thus, the present invention adjusts the sampling transistor 104 to match the reference source 126, and the cell current 302 of the memory cell 102 flows through the same bit line control device and sampling transistor as the reference current. As a result, the present invention advantageously avoids any mismatch effect between the bit line control devices and the mirror transistors.

FIG. 5 is a flowchart showing an example sensing method for reading a memory cell, such as an STT MRAM, in accordance with one embodiment of the present invention. For clarity, the method 500 for sensing a magnetic memory cell is described in context of the system 100 described in FIGS. 2 through 4. However, in alternate embodiments, other configurations may be used. Moreover, other embodiments may perform the steps described here in different orders and/or other embodiments may perform additional and/or different steps than those described here.

A sense or read path which may be connected to either a reference current source or a memory cell is provided at 502. The sense path comprises at least a sampling element 104 and a bit line control transistor 108. In one embodiment, the sampling element 104 is a diode connected MOS transistor. A reference current from the reference source is provided through the sense path at 504. The sampling transistor 104 samples and holds the reference current. At substantially the same time at 504, a precharge path for the memory cell 102 is provided at 506. After precharging the memory cell and sampling the reference current, the memory cell is disconnected from the precharge path at 508. The memory cell 102 is then connected to the sense path, and a memory cell current is provided through the sense path 202 and the sampling transistor 104 at 510. The output level of the sensing system 100 is then determined at 512.

One skilled in the art will realize that the present invention is not limited to sensing STT MRAM cells as described above but that the present invention may also be used for other memories that employ a current sensing scheme and have a small read window. For example, the present invention may also be used with multilevel cells, phase change RAM (PCRAM), conductive bridging RAM (CBRAM), etc. . . . The advantage of the present invention is the elimination of the error introduced by the current mirror mismatch and mismatch in bitline and reference line voltage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for reading a memory cell, comprising:
providing a sampling transistor for sampling a reference current in a read path while a capacitance is connected to a drain or source of the sampling transistor; and
measuring a cell current from the memory cell using the sampling transistor through the same read path while the capacitance is disconnected from the drain or source of the sampling transistor.

2. The method of claim 1, further comprising providing a reference source which provides the reference current through the sampling transistor.

3. The method of claim 1, wherein the sampling transistor element comprises a diode connected transistor.

4. The method of claim 1, further comprising generating the reference current and sampling a voltage across at least a portion of the sampling transistor on a capacitance.

5. The method of claim 1, further comprising providing a precharge path for the memory cell, wherein the precharge path for the memory cell is a different path from the read path.

6. The method of claim 5, wherein providing the precharge path for the memory cell occurs around the same time as sampling the reference current from the memory cell using the sampling transistor.

7. The method of claim 6, further comprising switching the memory cell from the precharge path to the read path through the sampling transistor.

8. The method of claim 7, further comprising disconnecting the capacitance from the sampling transistor.

9. The method of claim 7, wherein an output of the memory cell is determined by a cell current through the read path after switching the memory cell to the read path working against the sampled reference current.

10. The method of claim 1, wherein the memory cell comprises an STT MRAM.

11. A system for reading a memory cell, comprising:
a reference source configured to provide a reference current for the memory cell;
a sampling transistor coupled to the reference source configured to sample and hold the reference current;
a bit line control device coupled to the reference source, the memory cell and the sampling transistor;
a capacitance connected to a source or drain of the sampling transistor, wherein the reference current is sampled by a voltage across the sampling transistor on the capacitance, and wherein the capacitance is disconnected from the source or drain of the sampling transistor when a memory cell current conducts through the sampling transistor,
wherein the reference current and the memory cell current selectively flow through the bit line control device and the sampling transistor.

12. The system of claim 11, wherein the memory cell comprises an STT MRAM.

13. The system of claim 11, wherein the sampling transistor comprises a diode connected sampling transistor.

14. The system of claim 11, further comprising a precharge path configured to charge the memory cell at substantially the same time as the reference current flows through the sampling transistor.

15. The system of claim 14, further comprising a switching circuit configured to disconnect the memory cell from the precharge path and then provide a cell current that flows through the sampling transistor.

16. The system of claim 15, wherein an output level of the memory cell is determined by the cell current working against the sampled reference current.

17. A system for sensing a memory cell, the memory cell having an associated reference source for providing a reference current, comprising:

a read path configured to be alternately coupled to either the reference source or to the memory cell via a switching circuit; and a precharge path selectively coupled to the memory cell via the switching circuit for precharging the memory cell, wherein the memory cell is switched from the precharge path to the read path after the reference current has flowed through the read path.

18. The system of claim 17, wherein the read path comprises a diode connected sampling transistor configured to sample and hold the reference current.

19. The system of claim 17, wherein the read path further comprises a bit line control device.

20. The system of claim 17, wherein the memory cell is coupled to the precharge path at substantially the same time that the reference current flows through the read path via the switching circuit.

21. The system of claim 17, wherein the reference current is sampled by a voltage across a sampling transistor on a capacitance in the read path.

22. The system of claim 20, wherein the memory cell is disconnected from the precharge path and then provides a cell current that flows through the read path via the switching circuit.

23. The system of claim 21, wherein the capacitance is disconnected from the sampling transistor via the switching circuit when the memory cell is switched from the precharge path to the read path.

24. The system of claim 17, wherein an output level of the sensing system is determined by a cell current working against the sampled reference current when the memory cell is switched from the precharge path to the read path.

25. The system of claim 17, wherein the memory cell comprises an STT MRAM.

26. A method for reading a memory cell, the method comprising:

selectively providing a sense path for the memory cell and an associated reference source;

providing a reference current through the sense path;

providing a precharge path for the memory cell at substantially the same time that the reference current is provided through the sense path;

disconnecting the memory cell from the precharge path; and providing a cell current from the memory cell through the sense path.

27. The method of claim 26, wherein the memory cell comprises an STT MRAM.

28. The method of claim 26, wherein the sense path comprises a sampling transistor.

29. The method of claim 28, wherein the sampling transistor comprises a diode connected sampling transistor.

30. The method of claim 28, wherein the reference current is sampled by a voltage across a gate of the sampling transistor on a capacitance as it flows through the sense path.

31. The method of claim 28, further comprising measuring the cell current from the memory cell using the sampling transistor.

32. The method of claim 26, wherein the memory cell resides within a sensing system, and wherein an output of the sensing system is determined by the cell current working against the sampled reference current when the cell current is provided through the sense path.

* * * * *

UNITED STATES PATENT AND TRADEMARK OFFICE
CERTIFICATE OF CORRECTION

PATENT NO. : 8,837,210 B2  
APPLICATION NO. : 13/592404  
DATED : September 16, 2014  
INVENTOR(S) : Mihail Jefremow et al.

Page 1 of 1

It is certified that error appears in the above-identified patent and that said Letters Patent is hereby corrected as shown below:

In the Claims

Column 6, claim 3, lines 13 & 14; please replace "transistor element comprises…" with --transistor comprises…--

Signed and Sealed this  
Second Day of December, 2014

Michelle K. Lee  
*Deputy Director of the United States Patent and Trademark Office*